United States Patent [19]
Ishibashi et al.

[11] Patent Number: 5,422,839
[45] Date of Patent: Jun. 6, 1995

[54] SEMICONDUCTOR MEMORY DEVICE

[75] Inventors: Koichiro Ishibashi, Kodaira, Japan; Katsuro Sasaki, Burlingame, Calif.; Kunihiro Komiyaji, Hachiouji, Japan; Toshiro Aoto, Musashimurayama, Japan; Sadayuki Morita, Akishima, Japan

[73] Assignees: Hitachi, Ltd.; Hitachi ULSI Engineering Corporation, Tokyo, Japan

[21] Appl. No.: 118,645

[22] Filed: Sep. 10, 1993

[30] Foreign Application Priority Data

Sep. 10, 1992 [JP] Japan .................................. 4-241719

[51] Int. Cl.[6] ............................................ G11C 29/00
[52] U.S. Cl. ......................................... 365/51; 365/63; 365/154; 257/773; 257/775
[58] Field of Search .................... 365/51, 63, 154, 155, 365/156, 205, 206, 207, 208, 230.03, 200, 201; 257/773, 774, 775, 776, 758

[56] References Cited

U.S. PATENT DOCUMENTS

| | | | |
|---|---|---|---|
| 4,881,203 | 11/1989 | Watanabe et al. | 365/230.03 |
| 4,958,325 | 9/1990 | Nakagome et al. | 365/207 |
| 5,061,980 | 10/1991 | Uchida | 365/230.03 |
| 5,140,550 | 8/1992 | Miyaska et al. | 365/63 |
| 5,151,761 | 9/1992 | Takebuchi | 257/758 |
| 5,175,604 | 12/1992 | Nogami | 365/205 |
| 5,228,000 | 7/1993 | Yamagata | 365/201 |
| 5,295,114 | 3/1994 | Kobayashi | 365/200 |

OTHER PUBLICATIONS

Hirose et al., "A 20ns 4Mb CMOS SRAM with Hierarchical Word Decoding Architecture", 1990 IEEE ISSCC pp. 132–133 Feb. 15, 1990.

Primary Examiner—Joseph A. Popek
Assistant Examiner—Vu Le
Attorney, Agent, or Firm—Antonelli, Terry, Stout & Kraus

[57] ABSTRACT

A semiconductor static memory device, which has an increased storage capacity without imposing an increased access time, includes first, second and third metallic layers. To begin, word lines for the transfer MOSFETS are formed of the same polysilicon layer used to form the gate electrodes of the transfer MOSFETs of the memory device. A metallic layer of the first layer is used for local word lines, with the polysilicon word lines and local word lines being connected at their ends or inside of cell arrays. A metallic layer of the second layer is used for bit layers, and a metallic layer of the third layer is used for main word lines. Consequently, the word lines have a decreased time constant, allowing fast memory access. Each of sense amplifiers used in the memory device are formed with MOSFETs, which are disposed divisionally in adjacent locations. Preferably the gate electrodes of the divided MOSFETs are located symmetrically. In this case, the offset voltage of the sense amplifiers decreases significantly.

18 Claims, 11 Drawing Sheets

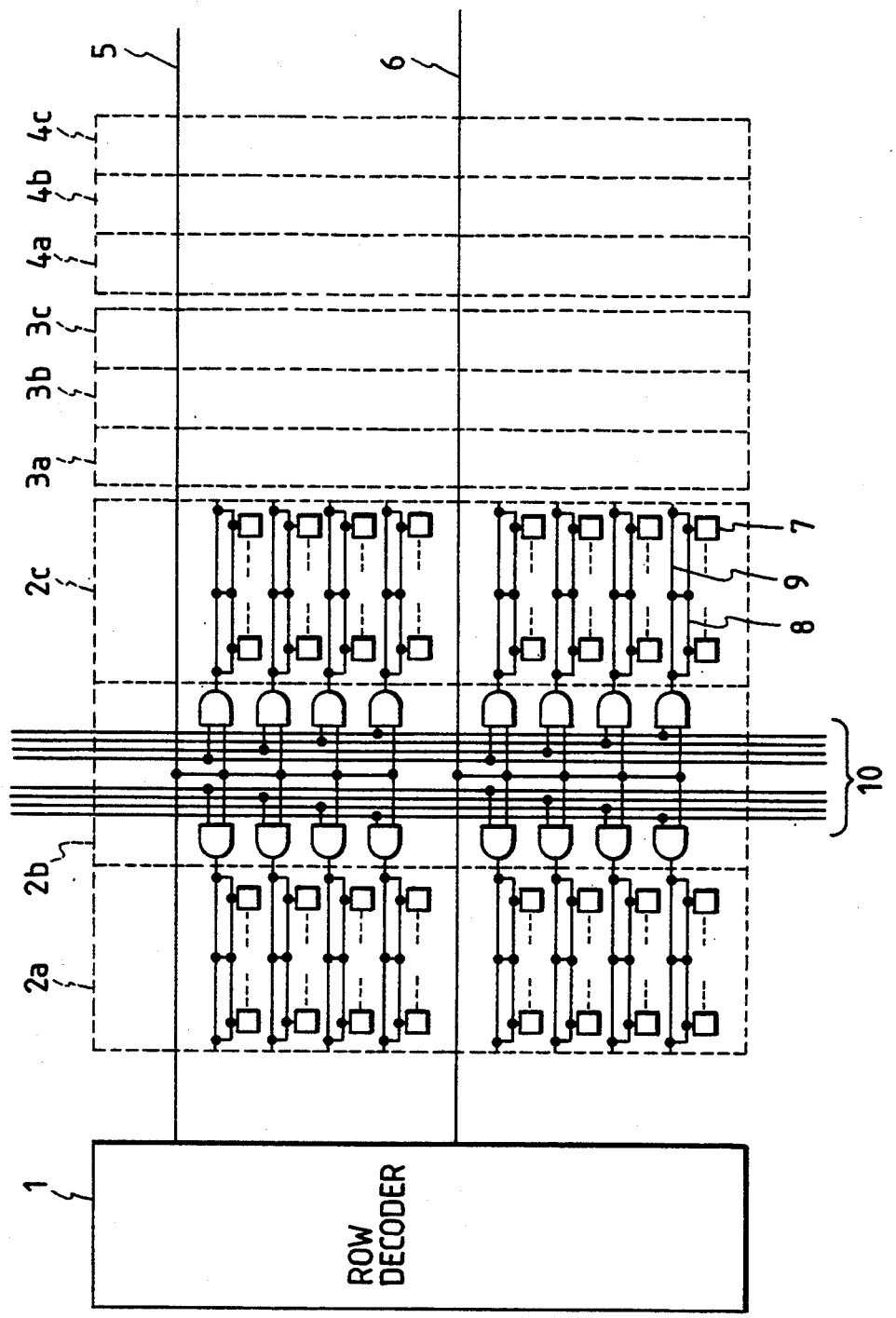

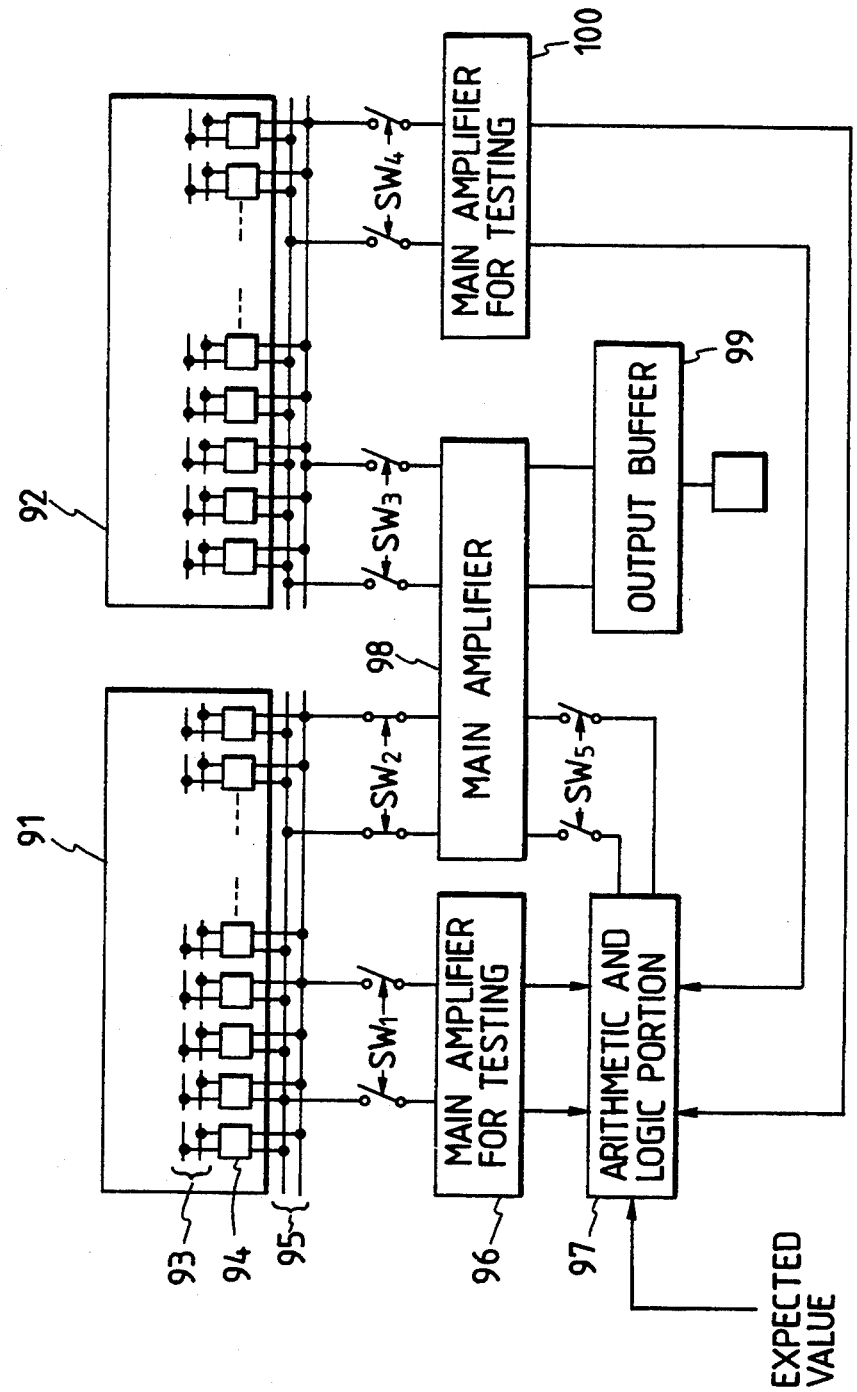

SEMICONDUCTOR MEMORY DEVICE

BACKGROUND OF THE INVENTION

The present invention relates to a semiconductor memory device having a large storage capacity and fast operational performance, and particularly to a semiconductor static memory device having a storage capacity as large as 16M bits or more which is still capable of operating fast.

For accomplishing a fast, high storage capacity semiconductor memory device, circuitry is known which operates on a large-capacity semiconductor static memory device to achieve the fast operation, as described in an article by Hirose et al. entitled "A 20ns 4Mb CMOS SRAM with Hierarchical Word Decoding Architecture" published in the ISSCC 90 Digest of Technical Papers, Vol. 33 (IEEE, 1990), pp. 132-133, for example. This prior art is pertinent to a 4M-bit semiconductor static memory device.

The above-mentioned conventional 4M-bit memory device has a structure of memory cell array of 1024 rows by 4096 columns on a chip. In case the device has only one row decoder, the number of column address lines for each row is large, i.e., 4096 lines, and resulting long word lines which are formed of polysilicon having a large resistance will incur an increased delay time. In dealing with this matter, the above-mentioned conventional memory device is designed to divide memory cells into a plurality of cell arrays so as to reduce the length of word lines formed of polysilicon, thereby preventing the increase of delay time.

In this memory device, each cell array is provided with a local row decoder which performs a logical AND operation between the cell array select signal and the global word lines passing through a memory cell which is selected by a row decoder, and a word line is selected by the output of the local row decoder. The device necessitates local row decoders equal in number to the cell arrays, resulting in an increased chip area needed for the local row decoders.

A static RAM of 4M bits or more consists of a large number of memory cells inherently, and therefore it will not fit in a standard package if the chip area increases excessively. On this account, the number of divisions of memory cells must be reduced to minimize the increase of chip area, and therefore the reduction in the length of word lines is limited and an increased delay time cannot be avoided.

SUMMARY OF THE INVENTION

An object of the present invention is to overcome the foregoing prior art difficulty and provide a semiconductor memory device which has a large storage capacity without imposing an increased delay time of operation. A more specific object of this invention is to provide a semiconductor static memory device which has a decreased number of local row decoders by using multiple cell arrays each consisting of a relatively large number of memory cells thereby to prevent the increase of chip area, and yet does not impose an increased delay time.

In order to achieve the above objectives, the inventive semiconductor static memory device employs a metallic wiring arrangement including three layers, of which a metallic layer of the first layer is used for local word lines, and is connected to polysilicon word lines at the end or inside of the cell array. A metallic layer of the second layer is used for bit lines, and a metallic layer of the third layer is used for main word lines.

According to one preferred form of this invention, although it is not obligatory, a MOSFET provided at the middle of each bit line pair for equalizing the bit line voltages in response to a pulse signal which is produced when the operation cycle has turned from writing to reading.

Preferably, the bit line pair has a smaller signal voltage swing and the MOSFET layout pattern is designed such that the amplifier which amplifies the data signal voltage swing has a small offset voltage.

In case the memory cell array is divided into multiple blocks, with spare bits which relieve defective bits being included in each block, a defective bit emerging in a block is relieved by a spare bit within the same block.

Generally, when multiple metallic layers are formed on a substrate, an upper metallic layer becomes thicker relative to a lower one due to the fabricating process, and accordingly the upper layer has a lower sheet resistance. For example, among three metallic layers, the first (lowest) layer made of tungsten has a sheet resistance of 500 mΩ/sq, the second layer of aluminum is 200 mΩ/sq, and the third (uppermost) layer of aluminum is 50 mΩ/sq.

For the reduction of delay time, it is desirable to use an upper metallic layer having a low resistance for longer lines. In the inventive memory device, a metallic layer of the third layer of the lowest resistance is used for the main word lines which are the longest wiring, and a metallic layer of the first layer is used for the local word lines which are relatively short wiring.

In the semiconductor static memory device of this invention, a complete set of memory cells is divided at least in the column direction (divided by division lines parallel to the column direction) into multiple cell arrays so that the word lines made of polysilicon become shorter thereby to prevent the increase of delay time, and in this case the number of cell arrays is minimized so that the increase of the chip area due to the provision of local row decoders for individual cell arrays is within the allowable range, with a metallic layer of the first layer being assigned to the local word lines which shunt the polysilicon word lines for preventing the increase of delay time that is due to the slightly elongated polysilicon word lines attributable to the smaller number of cell arrays. The formation of the local word lines with a metallic layer is desirable to minimize the delay time not only for the case of a smaller number of cell arrays, but also for the case of a large number of cell arrays.

The above-mentioned semiconductor static memory device, which is generally called an "SRAM" (Static Random Access Memory), is intended to have a storage capacity of 4M bits or more in this invention, but the present invention is of course applicable to memory devices of smaller storage capacities.

When a metallic layer of the first layer is used for the local word lines, it is preferably formed over the load elements of the memory cells. The load elements are formed in virtually the entire memory cell area and therefore the metallic layer of the first layer for the local word lines is naturally formed over the load elements so that the area is used efficiently.

For each memory cell, a metallic layer of the second layer is formed over the metallic layer of the first layer and in the direction virtually perpendicular to it, and the metallic layer of the third layer is formed over the second layer and in the direction virtually perpendicular to it. Accordingly, all metallic layers are formed over the load elements, and this wiring structure minimizes the increase of memory cell area. These metallic layers are formed of aluminum, tungsten or the like used conventionally.

The inventive semiconductor static memory device (SRAM) has its memory cells each consisting of two drive MOSFETs, two transfer MOSFETs and two load elements.

According to a representative form of this invention, which retains the function of selecting a memory cell in the row direction based on the main word line, the local word lines having a resistance smaller than that of the polysilicon word lines are connected to the polysilicon word lines at both ends and inside of the cell array, and therefore the overall resistance of word lines is effectively made smaller and the signal delay time can be reduced even if the word lines are elongated to some extent due to the use of a large cell array.

According to a more preferable form of this invention, a pulse signal is generated when the write circuit activation signal and the write enable (WE) signal turn from writing to reading, and this pulse signal is used to turn on the equalizing MOSFET formed in the middle of the bit line pair. Because of this disposition of equalizing MOSFET, the distance from it to the end of the bit line pair is half the case in which it is located at the end of the bit line pair. Accordingly, the resistance and capacitance are both halved, and the time constant is reduced to ¼. Consequently, even if the bit lines are elongated for a larger cell array of memory cells, the equalizing operation for the bit line pair can be completed in a short time, and a read operation immediately after a write operation is not retarded.

According to a more preferable form of this invention, sense amplifiers which amplify the signal voltages on bit lines are formed by using such a layout arrangement that the offset voltage of sense amplifier is small, and therefore erroneous readout of information does not occur. For the reduction of the offset voltage of sense amplifier, the MOSFET which constitute each sense amplifier is formed divisionally in adjacent location on the substrate, with the gate electrodes being arranged symmetrically with respect to a point or axis as shown in FIG. 5b and FIG. 5c. Based on this MOSFET layout the amplifier, its uneven properties attributable to the locations of MOSFETs are cancelled out and its offset voltage decreases significantly.

The above-mentioned layout manner of the sense amplifiers for the reduction of offset voltage can also be applied favorably to the sense amplifiers or column amplifiers of semiconductor dynamic memory devices, i.e., DRAMs. Since DRAMs operate inherently at a small signal voltage swing on bit lines, data readout can readily be sped up by use of these sense amplifiers having a small offset voltage.

According to a more preferable form of this invention, a chip is divided into blocks, with defective bits in each block being relieved by spare memory cells in the same block, and therefore the length of wiring of the signal which controls the defect relief circuit is determined from the dimension of block and the delay time is shorter as compared with the case without block division. Accordingly, the inventive memory device is also operative to relieve defective bits without imposing an increased access time.

BRIEF DESCRIPTION OF THE DRAWINGS

FIG. 1a is a diagram showing in brief the memory cell matrixes of the semiconductor memory device based on an embodiment of this invention;

FIG. 11 is a block diagram showing the semiconductor memory device inspection manner based on still another embodiment of this invention.

DESCRIPTION OF THE PREFERRED EMBODIMENTS

Embodiments of this invention will be explained in detail with reference to the drawings.

EMBODIMENT 1

This embodiment is a 16M-bit SRAM in which 32 memory cell arrays, each made up of 1024 rows by 128 columns, form a block and four blocks form the memory device. Each block is provided with a row decoder individually.

Figure 1B:
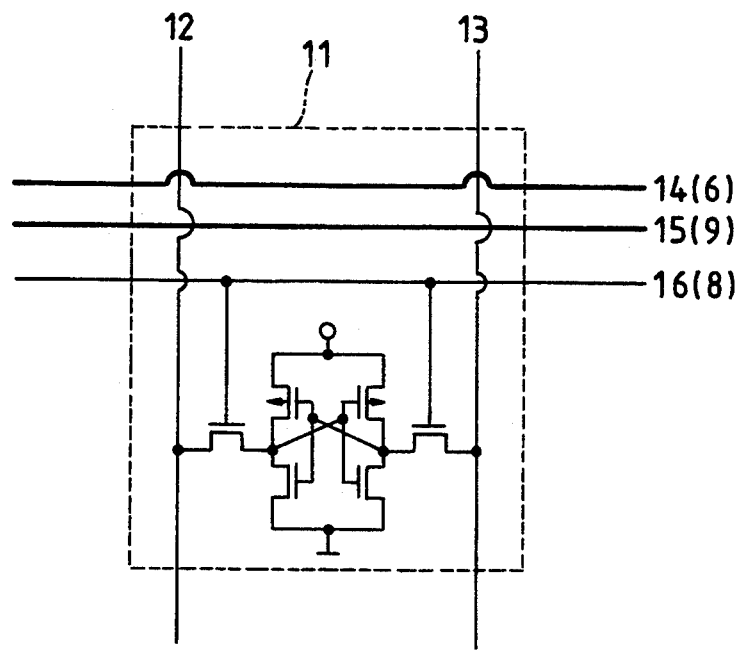
FIG. 1b is a schematic diagram of the memory cell of the semiconductor memory device based on this embodiment.
Figure 2:
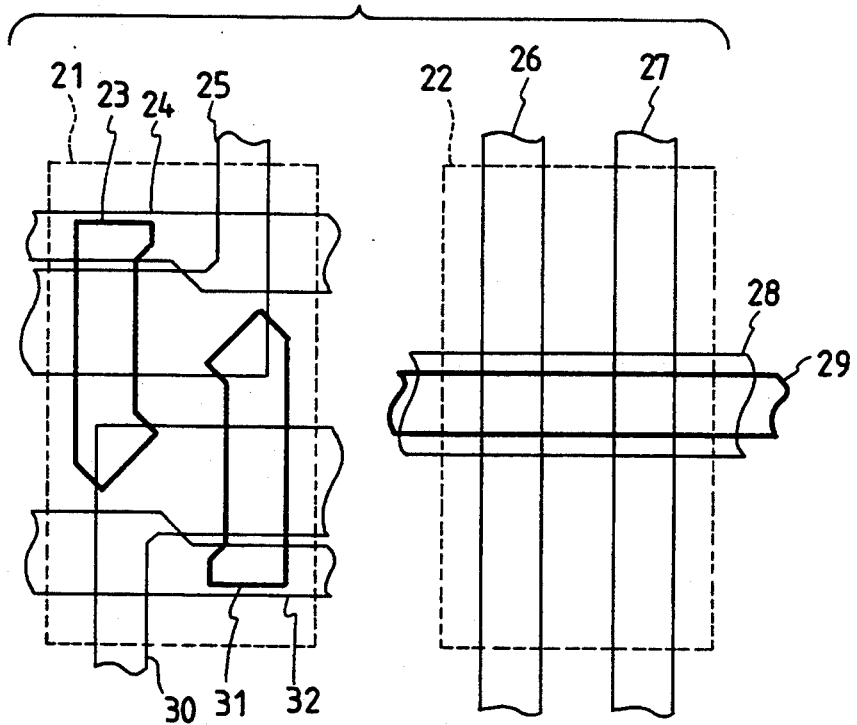
FIG. 2 is a diagram showing the layout of a memory cell in the semiconductor memory device based on this embodiment.

FIGS. 1a and 1b and FIG. 2 show the memory cell matrixes, memory cell circuit and memory cell layout, respectively.

In FIG. 1a, reference numeral 1 denotes a row decoder, 2a, 2c, 3a, 3c, 4a and 4c are memory cell matrixes, 2b, 3b and 4b are local row decoders, 5 and 6 are main word lines, 9 is a local word line, 8 is a word line formed of polysilicon for the gate electrodes of transfer MOSFETs, 7 is a memory cell, and 10 is a matrix select signal.

In FIG. 1b, in which the circuit arrangement of the memory cell 7 is indicated by 11, reference numeral 16 is the word line 8 formed of polysilicon, 15 is the local word line 9 formed of a metallic layer of the first layer, 12 and 13 are bit lines formed of a metallic layer of the second layer, and 14 is the main word line 6 formed of a metallic layer of the third layer.

In response to the address signal, the row decoder 1 selects a main word line 6, the local row decoder 2b takes logical AND between the selected main word line 6 and the matrix select signal 10 to select a local word line 9, and a word line 8 in connection with the selected local word line 9 is finally selected. Memory cell matrixes are disposed on both sides of a local row decoder.

In order for this memory cell arrangement to have a smaller chip area, it is necessary to decrease the number of matrixes by increasing the number of memory cells connected to a word line thereby to decrease the number of local row decoders. For example, by increasing the number of memory cells connected to a word line from 64 bits to 128 bits, the number of local row decoders can be halved. However, the capacitance and resistance of the word line are both doubled, and the resulting 4-fold time constant will incur a significant increase of delay time.

In this embodiment, the local word line 9 formed of the metallic layer of the first layer is placed in parallel to the word line 8, and the local word line 9 is connected to the word line 8 at its both ends and center. In case the word line 8 is made of silicide such as $WSi_2$ and the local word line 9 is formed of a layer of tungsten or the like, these lines 8 and 9 will have sheet resistances of about 10 $\Omega$/sq and 0.5 $\Omega$/sq, respectively, resulting in a reduced resistance by at least one digit, and the time constant will not increase even if the number of memory cells connected to the word line 8 is doubled.

Since the metallic wiring layer 15 of the first layer is used for the local word line, it is possible to wire the main word lines from the row decoder 1 by use of the metallic wiring layer 14 of the third layer, as shown in FIG. 1b. Consequently, this embodiment enables the increase of the size of memory cell matrix without increasing the time constant of word line, while retaining the function of selecting a memory cell in the row direction by the main word line.

In FIG. 2 showing the layout of a memory cell, reference numerals 21 and 22 indicate the range of the memory cell. Indicated by 25 and 30 are diffusion layers, and 23 and 31 are polysilicon layers forming the gate electrodes of the drive MOSFETs of the memory cell. The polysilicon layer 31 and diffusion layer 25, and the polysilicon layer 23 and diffusion layer 30 are each connected together to form a flip-flop circuit.

Indicated by 24 and 32 are polysilicon layers of the second layer, and they form the gate electrodes of the transfer MOSFETs of the memory cell, i.e., the word line. Indicated by 28 is a metallic wiring layer of the first layer which forms the local word line, 26 and 27 are metallic wiring layers of the second layer which form the bit line pair, and 29 is a metallic wiring layer of the third layer which forms the main word line.

As shown in FIG. 2, the metallic layers 28 and 29 are used for the wiring in the row direction, besides the polysilicon layers 24 and 32 which form the word line. With the metallic wiring layer 29 being assigned to the main word line, the low-resistance metallic wiring layer 28 is connected to the high-resistance polysilicon layers 24 and 32 for the word line at the middle or end of the memory cell matrix, and consequently even if the number of memory cells connected to a word line increases, the word line does not have an increased time constant and thus a fast-operating SRAM can be accomplished.

The SRAM of the foregoing embodiment of the present invention has a delay time reduced by 2 to 3 ns as compared with the device based on the prior art described in the previously mentioned Hirose et al. article in ISSCC 90 Digest of Technical Paper Vol. 33 (1990), pp. 132-133, for example.

EMBODIMENT 2

The second embodiment is intended to attain a shorter delay time of data readout for an SRAM which consists of memory cells based on the foregoing first embodiment. The second embodiment will be explained with reference to FIGS. 3, 4, 5b, 6 and 7.

Figure 3:
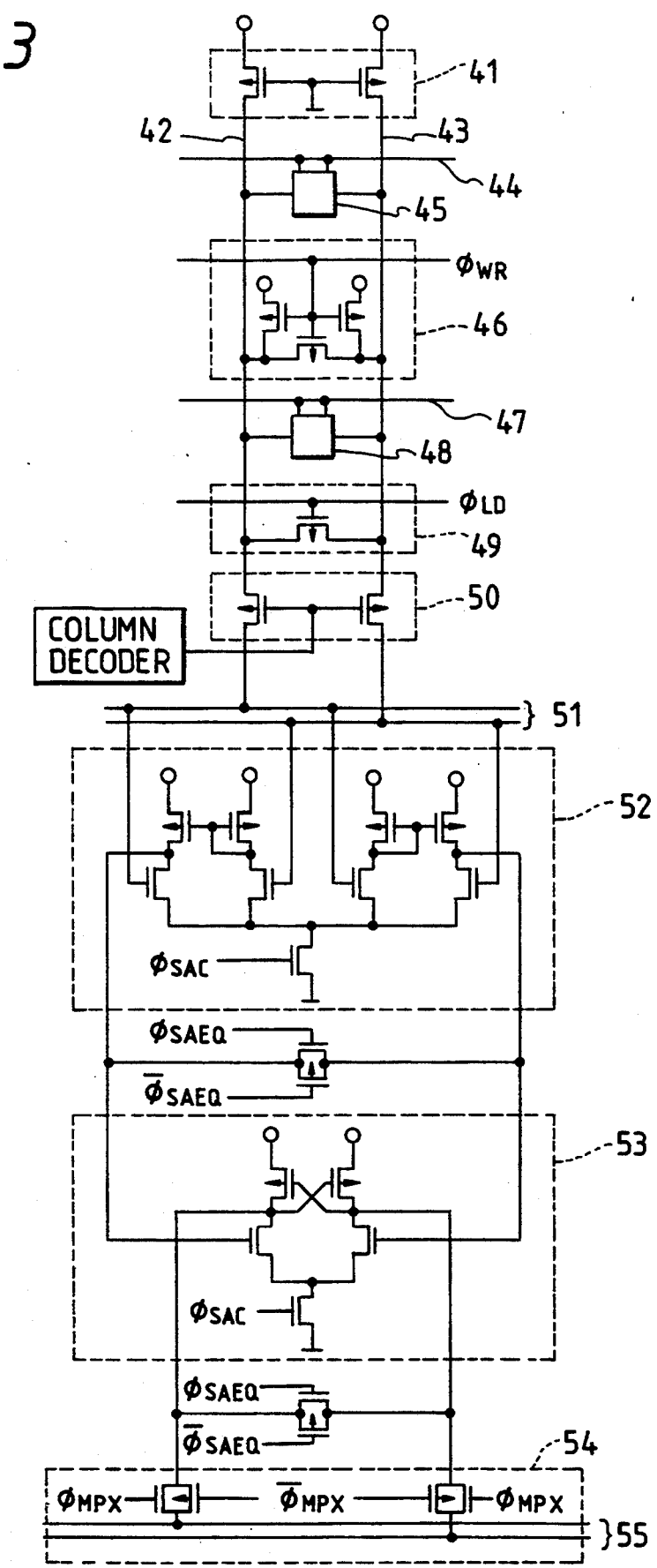
FIG. 3 is a schematic diagram of the data readout circuit in the semiconductor memory device based on another embodiment of this invention.

FIG. 3 shows the data readout circuit for memory cells. In the figure, reference numeral 41 denotes load MOSFETs, 42 and 43 are bit lines, 44 and 47 are word lines, 45 and 48 are memory cells, 46 are MOSFETs for equalizing the bit lines, 49 is a MOSFET for reducing the signal voltage swing, 50 is a column selector, 51 are common data lines, 52 is a first-stage sense amplifier, 53 is a second-stage sense amplifier, 54 is a multiplexer, and 55 is a data bus.

Indicated by $\phi_{WR}$ is a pulse signal for write recovery (it restores the data line voltage, which has varied largely at data writing, on completion of data writing), $\phi_{LD}$ is a pulse signal for controlling the signal voltage swing on the data line pair, $\phi_{SAC}$ is a pulse signal for sense amplifier control, i.e., sense amplifier control signal, $\phi_{SAEQ}$ is a pulse signal for sense amplifier equalization (it makes a short circuit between the two outputs of the sense amplifier to equalize the output voltages), $\overline{\phi_{SAEQ}}$ is an inverted $\phi_{SAEQ}$ signal, and $\phi_{MPX}$ is a pulse signal for controlling the multiplexer.

In this circuit arrangement, when the word line 44 or 47 is selected, data stored in the memory cell 45 or 48 is conducted in the form of a signal voltage swing to the bit lines 42 and 43, and the data is further conducted through the column selector 50 to the common data lines 51, and the voltage difference is amplified by the sense amplifiers 52 and 53.

In the preceding first embodiment which is intended to deal with an increased number of memory cell matrixes in the row direction, the increase of the number of matrixes in the column direction will result in an elongated time constant, e.g., if the number of memory cells connected to the bit lines 42 and 43 is doubled, the resistance and capacitance of the bit lines are both doubled, resulting in a 4-fold time constant. The second embodiment is intended to prevent the time constant from increasing even in such a case.

A primary problem encountered when the bit lines are elongated is the delay time of readout. In order to create a voltage difference appearing between bit lines at readout, it is necessary to drive the bit lines with MOSFETs of very small driving ability. An increased capacitance of bit lines requires an increased amount of charges to be driven, and therefore it takes a longer readout time in proportion.

This problem is overcome by this invention based on the following two schemes. The first scheme is reducing the signal voltage swing of bit lines thereby to reduce the amount of charges to be driven by the memory cell. The second scheme is adopting such a planar shape of sense amplifier that the offset voltage of sense amplifier decreases even smaller than the decreased signal voltage swing.

Figure 4:
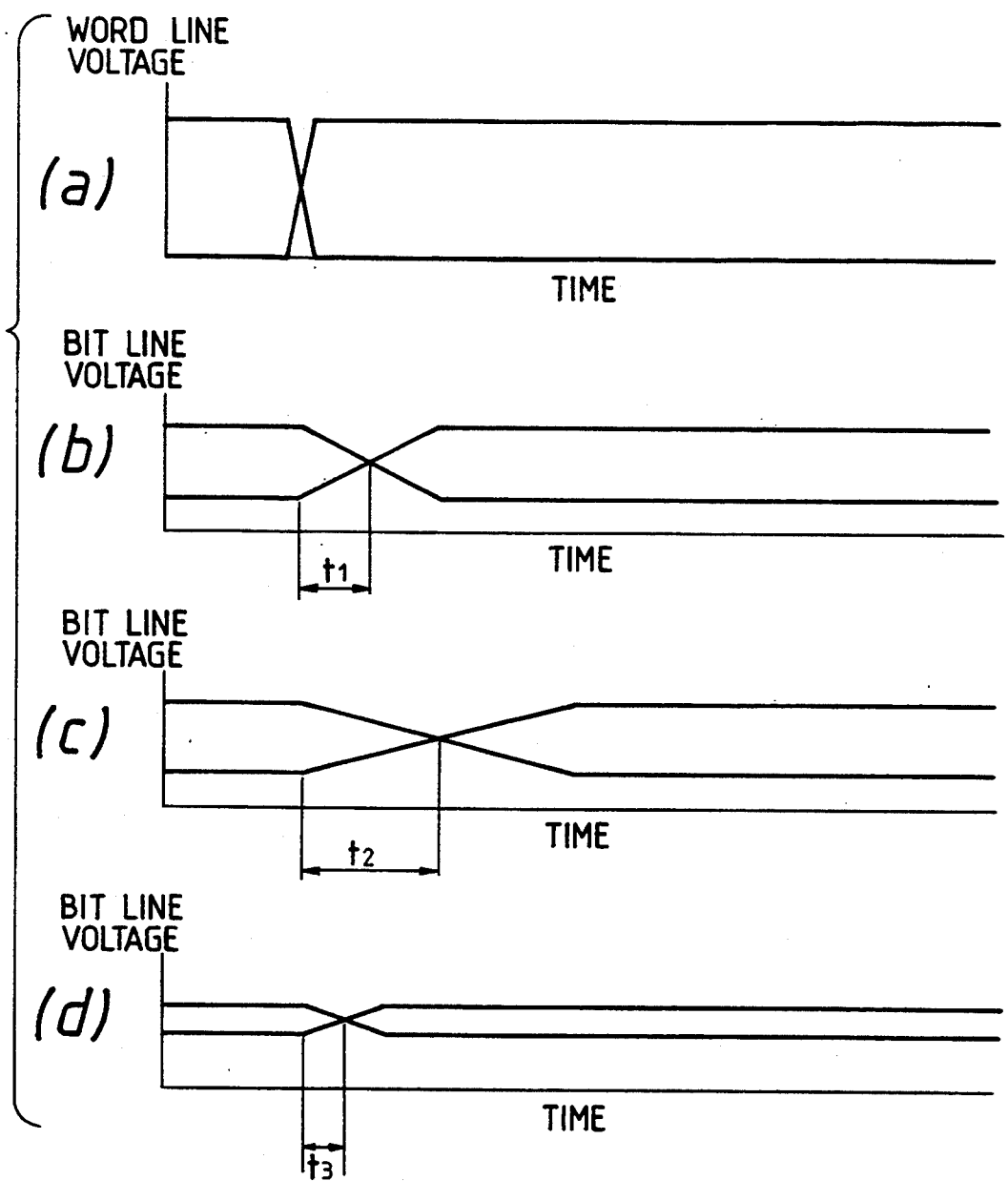
FIG. 4 is a timing chart showing the voltage waveforms during the operation of the semiconductor memory device of FIG. 3.

FIG. 4 shows the voltage waveforms on the bit lines resulting from the reduction of signal voltage swing. Shown by (a) is the voltage waveform on the word line, (b) is the voltage waveform of the conventional bit lines, (c) is the voltage waveform on the bit lines, with the capacitance being doubled, and (d) is the voltage waveform of a reduced signal voltage swing on the bit lines, with the capacitance being doubled.

The time length from the transition of word line voltage until the crossing of voltages on the bit line pair is defined to be $t_1$ as shown by (b). In the case of a doubled bit line capacitance shown by (c), the bit line drive by the same current value takes a time length $t_2$ which is as long as twice the $t_1$, resulting in an increased delay time. When the voltage difference between the bit lines is reduced, the amount of charges to be driven by the memory cell decreases, and it takes a time length $t_3$ shorter than the $t_1$ as shown by (d).

Accordingly, by reducing the signal voltage swing, the number of memory cells connected to a bit line pair can be increased without an increased delay of data readout. The signal voltage swing on the bit lines can be reduced by bringing the MOSFET 49 conductive in FIG. 3. In this case, however, it is necessary to reduce the offset voltage of the sense amplifier which amplifies the reduced signal voltage swing. If the offset voltage of sense amplifier exceeds the signal voltage swing on the bit lines, data may be read out erroneously, and therefore the offset voltage must be at least smaller than the signal voltage swing.

Figure 5A:
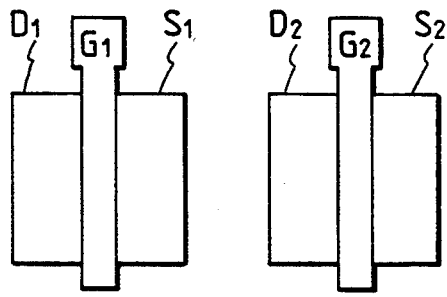
FIG. 5a is a diagram showing the layout of MOSFETs of a sense amplifier in the conventional semiconductor memory device.
Figure 5B:
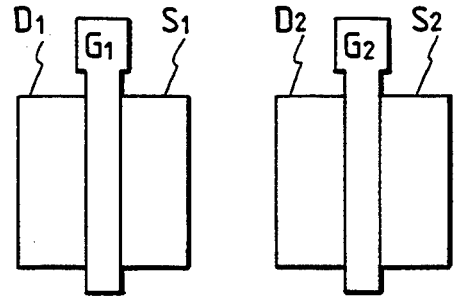
FIG. 5b and FIG. 5c are diagrams showing the layout of MOSFETs of a sense amplifier in the semiconductor memory device based on another embodiment of this invention.
Figure 5B:
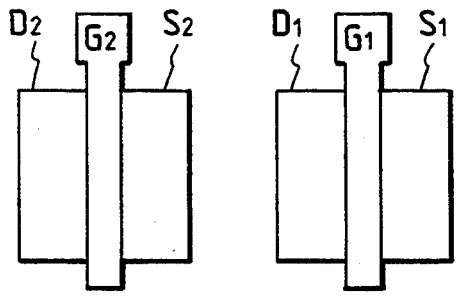
Figure 5C:
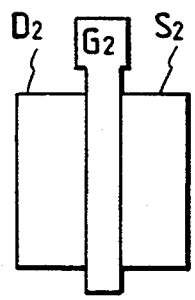
Figure 5C:
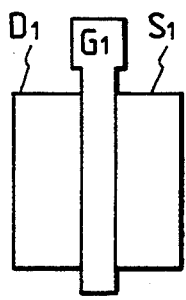
Figure 5C:
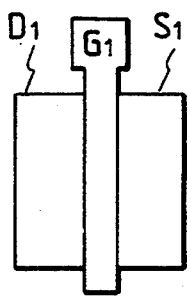
Figure 5C:
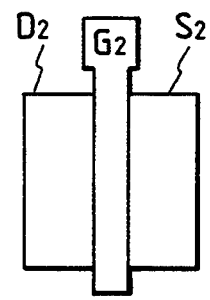
Figure 5C:
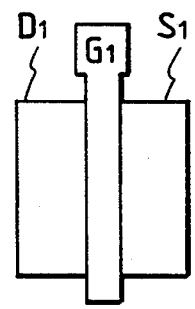
Figure 5C:
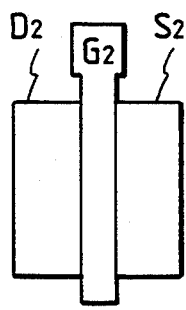
Figure 5C:
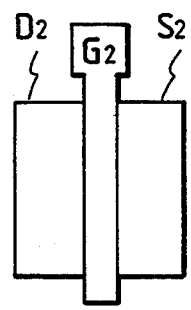
Figure 5C:
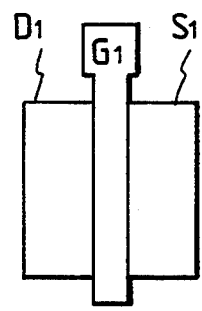

In this embodiment, the reduction of offset voltage is accomplished by modifying the layout arrangement of sense amplifier as shown in FIGS. 5a to 5c. Shown in FIG. 5a is the layout of MOSFETs of the conventional sense amplifier, and FIGS. 5b and 5c are the ones based on this invention. In these figures, indicated by G1 and G2 are gate electrodes, D1 and D2 are drain electrodes, and S1 and S2 are source electrodes of a set of MOSFETs in a sense amplifier.

The conventional sense amplifier shown in FIG. 5a consists of a pair of MOSFETs each having a gate electrode. In this case, if the threshold voltage of MOSFET is higher as the position moves to the right, for example, the MOSFET having G2 is higher than that of the MOSFET having G1, and this voltage difference creates an offset voltage of the sense amplifier. In contrast, the arrangement of this invention is designed to divide the gate electrode into two in the case of FIG. 5b, or into four in the case of FIG. 5c, so that all gate electrodes are disposed in a symmetric arrangement. Namely, the MOSFETs of FIG. 5b have gate electrodes G1 at the top left and bottom right positions and gate electrodes G2 at the top right and bottom left positions. Accordingly, even if the threshold voltage of MOSFET is higher in a rightward portion, both of the gate electrodes G1 and G2 have an even threshold voltage as the whole.

Figure 6:
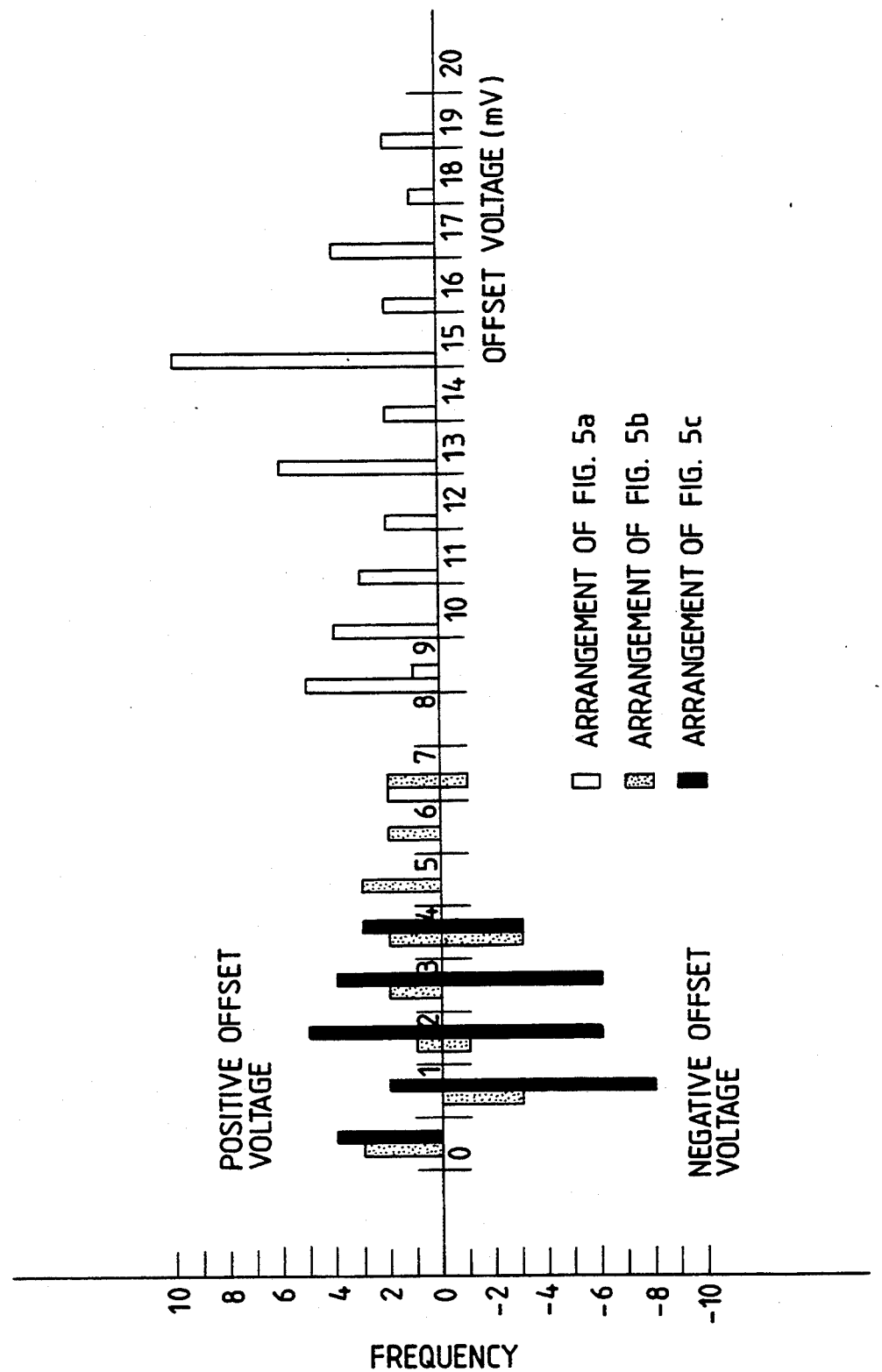
FIG. 6 is a graph showing the relation between the layout manner of MOSFETs of a sense amplifier and its offset voltages in a semiconductor memory device.

FIG. 6 is a histogram showing the result of measurement of the offset voltage of the sense amplifier depending on its layout arrangement. As shown on the graph, the conventional MOSFET arrangement shown in FIG. 5a creates an offset voltage of 19 mV at maximum, and accordingly the signal voltage swing of the bit line pair cannot be set smaller than this value. In the case of the MOSFET arrangements shown in FIGS. 5b and 5c, with the gate electrode being divided into two and four, the offset voltage is lowered to 9 mV and 4 mV at maximum, respectively, and accordingly the signal voltage swing of the bit line pair can be reduced for the fast data readout operation.

Another problem encountered when the bit lines are elongated is the delay of data readout when it takes place immediately after the write operation. This problem is overcome by this invention based on the following scheme.

Figure 7:
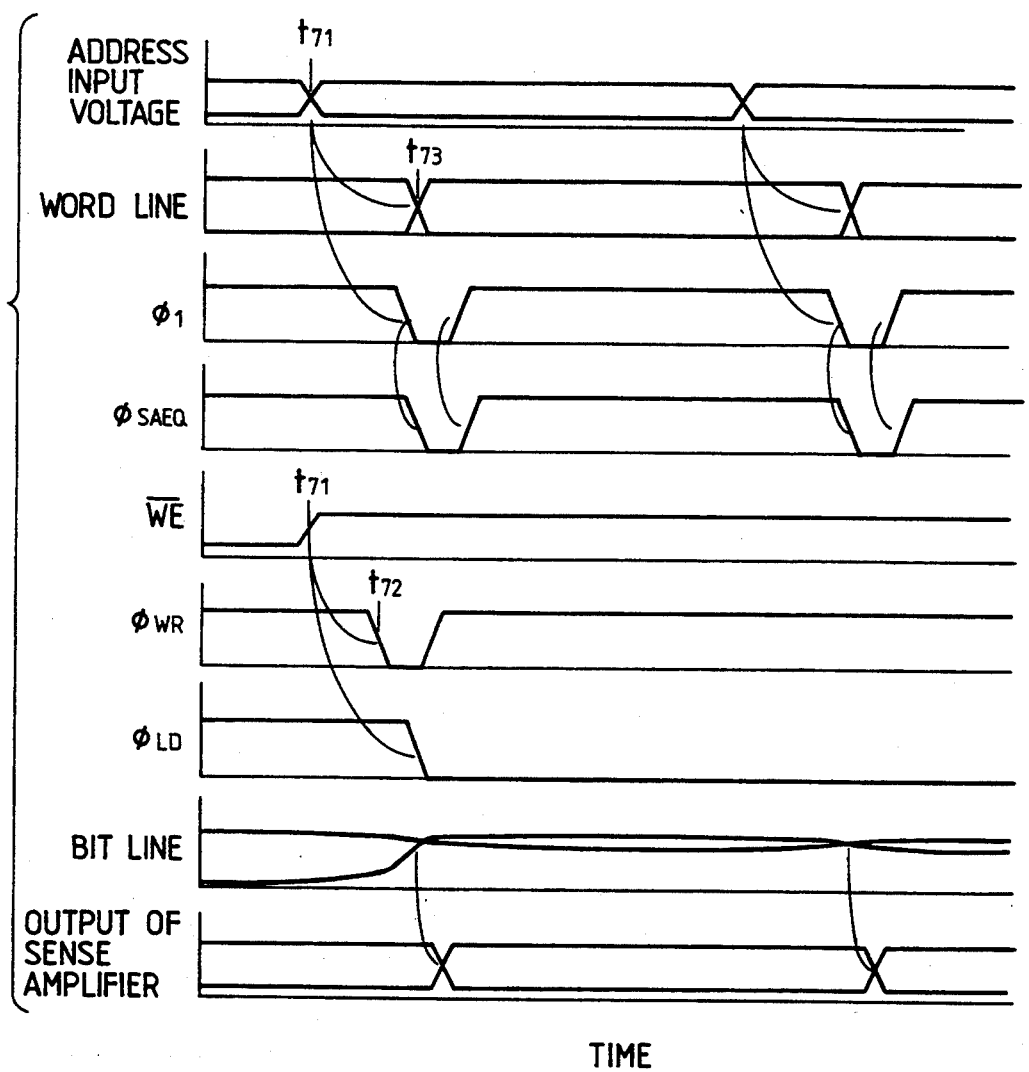
FIG. 7 is a timing chart showing the signal voltage waveforms at various portions of the semiconductor memory device based on this embodiment during the data readout operation immediately after the write operation.

FIG. 7 shows the signal voltage waveforms during the data readout operation immediately after the write operation. At the beginning, the $\overline{WE}$ signal (inverted WE signal) is low, indicative of the write cycle. At a time point $t_{71}$ when the address is switched, the $\overline{WE}$ goes high and the memory device enters the read cycle. Initially, at this time point, one bit line has a power voltage and another bit line has a ground voltage due to data writing in the previous cycle, and therefore there is a great voltage difference. Unless this voltage difference of bit line pair subsides until the time point $t_{73}$ when the word line is switched next, the data readout operation of this cycle will be retarded.

This embodiment is designed to generate a pulse signal $\phi_{WR}$ when the $\overline{WE}$ signal has made a transition and use the pulse signal to turn on the bit line equalizing MOSFET so that the bit lines which have finished data writing have the same voltage. The equalizing MOSFET 46 is disposed at the middle of the bit line pair as shown in FIG. 3. Consequently, the time constant of the bit line pair seen from the MOSFET 46 is reduced to about ¼ of that seen from the end of bit line, and even if an increased number of memory cells are connected to a bit line pair, the voltage difference can be equalized in a short time.

The signal $\phi_{LD}$ for controlling the MOSFET 49 which reduces the signal voltage swing of the bit line pair during the readout operation is also produced from the $\overline{WE}$ signal, and it turns on the MOSFET 49 only during the read cycle.

In summary, in this embodiment, the signal voltage swing of the bit line pair is reduced in the read cycle, MOSFETs of the sense amplifier are laid out so that it has a smaller offset voltage, and the bit line voltages are equalized at the transition from write cycle to read cycle by the MOSFET disposed at the middle of the bit line pair, and consequently an increased number of memory cells connected to a bit line pair do not incur an increased delay time.

In FIG. 7, shown by $\phi_t$ is a pulse signal which is produced when the address is switched, and the signals $\phi_{SAEQ}$, $\phi_{WR}$ and $\phi_{LD}$ are the signals explained in connection with FIG. 3.

EMBODIMENT 3

The previous second embodiment is pertinent to the sense amplifier having its offset voltage reduced so that it suits the amplification of the signal of a reduced voltage swing on the bit line pair. This sense amplifier consists of MOSFETs, which are laid out divisionally in two or four adjacent areas on the substrate, with their gate electrodes being located symmetrically as shown in FIGS. 5b and 5c. The amplifier of the foregoing arrangement is suitable for the sense amplifier of semiconductor dynamic memory devices (DRAMs) which inherently have a small swing of bit signal voltage.

The third embodiment of this invention is a semiconductor dynamic memory device (DRAM) having memory cells each consisting of an MOSFET and a capacitor and having associated sense amplifiers each including MOSFETs laid out as shown in FIGS. 5b or 5c.

Figure 8:
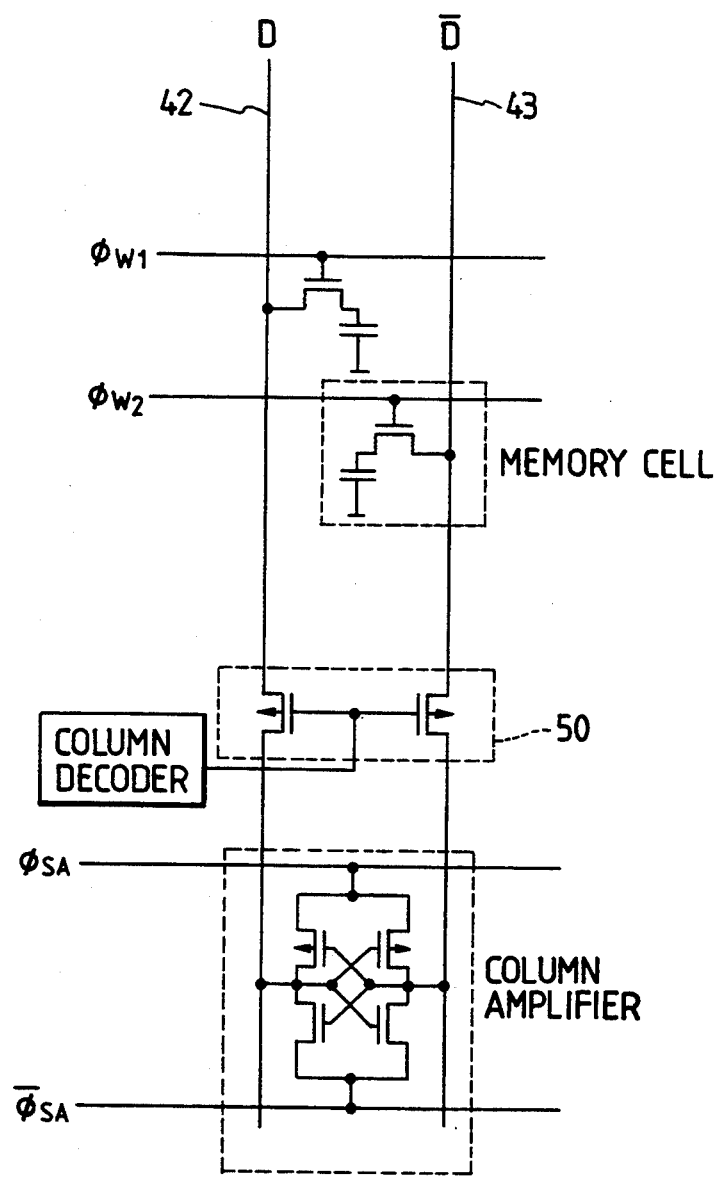
FIG. 8 is a schematic diagram showing the data readout circuit in the semiconductor memory device based on still another embodiment of this invention.

FIG. 8 shows the data readout circuit of a memory cell of the DRAM based on this embodiment. In the figure, reference numerals 42 and 43 denote bit lines, 50 is a column selector, $\phi_{W1}$ and $\phi_{W2}$ are pulse signals on the word lines, $\phi_{SA}$ is a pulse signal for controlling the sense amplifier, and $\overline{\phi_{SA}}$ is an inverted $\phi_{SA}$ signal.

The inventive DRAM having the sense amplifiers, with their MOSFETs being arranged as shown in FIGS. 5b or 5c, can operate at higher bit line signal voltages, which are generally small in DRAMs, owing to the small offset voltage of the amplifiers.

Figure 9:
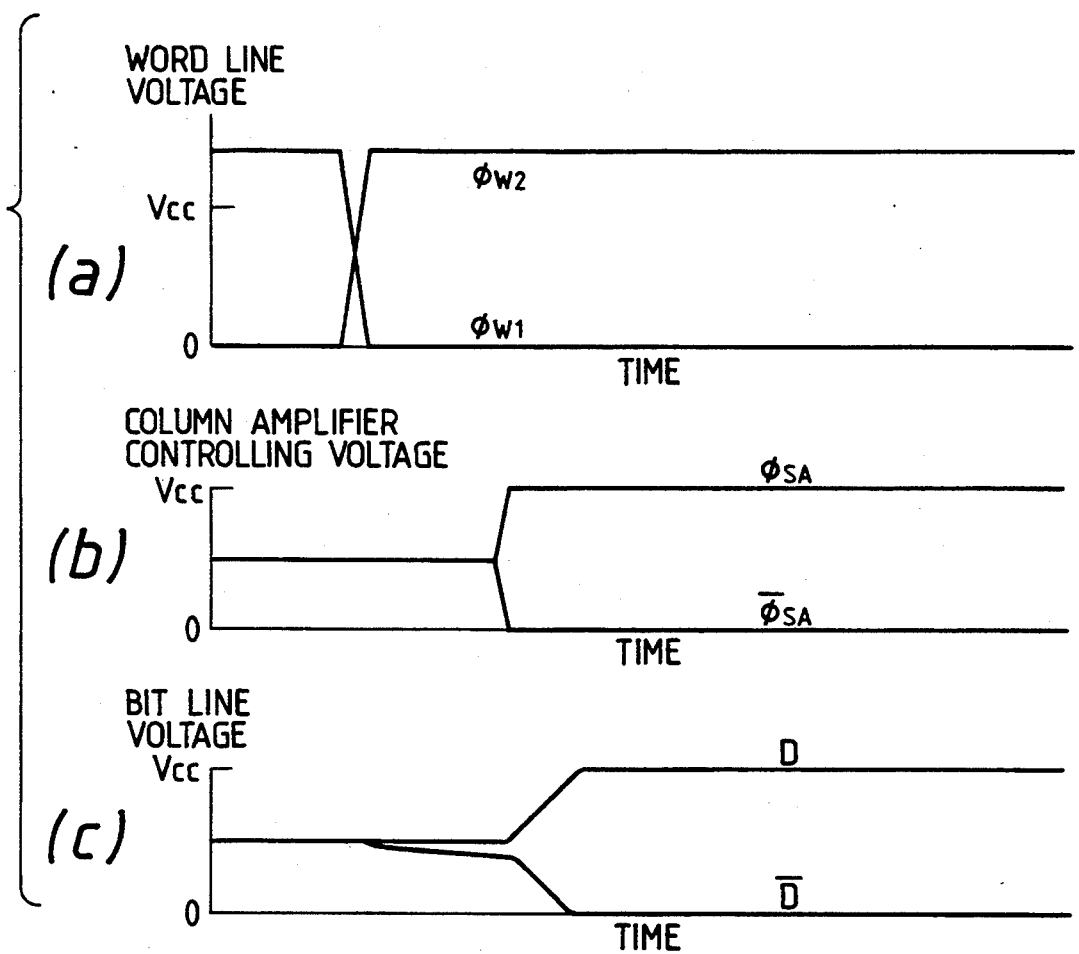
FIG. 9 is a timing chart showing the voltage waveforms during the operation of the semiconductor memory device based on this embodiment.

FIG. 9 shows the waveforms of the signals $\phi_{W1}$, $\phi_{W2}$, $\phi_{SA}$, $\overline{\phi_{SA}}$, D and $\overline{D}$ at the portions of the DRAM shown in FIG. 8.

EMBODIMENT 4

Figure 10:
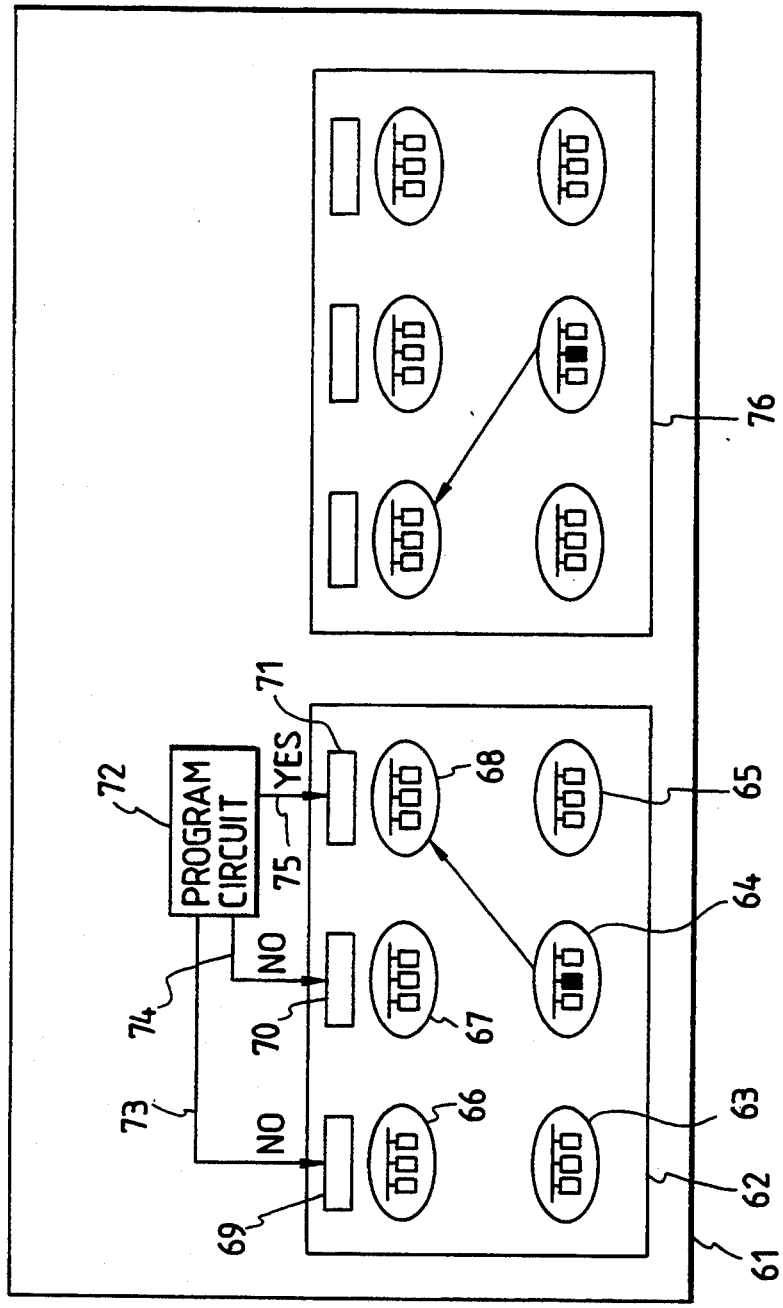
FIG. 10 is a diagram showing an embodiment of the defective bit relieving method applicable to the semiconductor memory device of this invention.

FIG. 10 shows the concept of the method of relieving a defective memory cell based on the fourth embodiment of this invention. In the figure, reference numeral 61 denotes a chip of a semiconductor memory device, 62 and 76 are cell blocks, 63, 64 and 65 are memory cells connected to a word line, 66, 67 and 68 are memory cells used to relieve defective memory cells, and 69, 70 and 71 are sense amplifiers associated with the memory cells 63 and 66, 64 and 67, and 65 and 68, respectively, for reading out data. Indicated by 72 is a program circuit, which provides control signals 73, 74 and 75 for the sense amplifiers 69, 70 and 71.

This embodiment is the case of the memory cell 3, 74 partition into two blocks. In case the memory cell 64 connected to the word line in the block 62 becomes defective, it is relieved by a memory cell, e.g., 68, within the same block as shown by the arrow in the figure, instead of using a memory cell in another block 76. The program circuit 72 detects the addressing to a defective memory cell to determines a sense amplifier to be activated, and produces the control signal for it. For example, for the relief of the defective memory cell 64 in the block 62, it is necessary not to amplify the data from the memory cell 64 but to amplify the data from the memory cell 68. Accordingly, it is necessary to activate the control signal 75 and to make the control signals 73 and 75 inactive, and this control signal is output to the sense amplifier in block 62.

In this embodiment, memory cells are divided into blocks and a defective memory cell in a block is relieved by a relief memory cell within the same block. Accordingly, a set of control signals are used for sense amplifiers within a block, and they can have a short wiring and thus a short delay time. Consequently, this embodiment is effective for relieving defective memory cells without imposing an increased delay time when the semiconductor memory device has an increased scale of integration.

EMBODIMENT 5

FIG. 11 shows the concept of the method of inspecting a large number of memory cells at once based on the fifth embodiment of this invention. In the figure, reference numerals 91 and 92 are cell blocks, 93 are common data lines, 94 are sense amplifiers, 95 is a data bus, 96 and 100 are main amplifiers for testing, 98 are main amplifiers, 97 is an arithmetic and logic circuit, 99 are output buffers, and SW1-SW5 are control signals to MOSFET-based switches.

During the normal operation, data read out of a memory cell in the block 91 is placed on the data bus 95 by the sense amplifier 94 and conducted to the main amplify 98 through the switch which is turned on by the control signal SW2. After the data is amplified by the main amplifier, it is sent out through the output buffer 99.

In the test mode for inspecting a large number of memory cells at once, the control signals SW1, SW4 and SW5 become active and the SW2 and SW3 become inactive. In this state, the sense amplifiers of the block 91 and block 92 are activated and readout data are placed on the data buses. The data on the data buses are conducted to the main amplifiers 96 and 100 for testing, and their outputs are applied to the arithmetic and logic circuit 97.

The arithmetic and logic circuit 97 produces an output signal of "1" if all data from the main amplifiers for testing match the expected values, or otherwise it produces an output signal of "0". The output signal is supplied to the main amplifier 98 so that it is sent out of the chip. In this manner, data of different blocks are read out simultaneously and compared with expected values, and a large number of memory cells can be tested in a short time.

The foregoing second, fourth and fifth embodiments provide satisfactory results for the memory cell matrix arrangement explained in the first embodiment.

According to this invention, as described above, a semiconductor memory device can be fabricated in a relatively large memory cell matrix arrangement, so that the chip area need not be expanded, without incurring an increased delay time of operation.

What is claimed is:

1. A semiconductor memory device comprising:
   a plurality of memory cells of static type formed on a semiconductor substrate in a row direction and a column direction to form a memory cell array, each memory cell including two drive MOSFETs, two transfer MOSFETs and two load elements;
   a first metallic layer formed over at least said load elements;
   a second metallic layer formed over said metallic layer of the first layer wherein said second metallic layer has a lower sheet resistance than said first metallic layer; and
   a third metallic layer formed over said metallic layer of the second layer, wherein said third metallic layer has a lower sheet resistance than said second metallic layer,
   wherein first word lines coupled to gate electrodes of the transfer MOSFETs of memory cells arrayed in the row direction are formed of a polysilicon layer,
   wherein a bit line pair connected to the transfer MOSFETs of memory cells arrayed in the column direction is formed in the column direction by said second metallic layer,
   wherein main word lines, which are disposed over said memory cells arrayed in the row direction and selected by row decoders, are formed by said third metallic layer,
   wherein local word lines, which are selected by signals on said main word lines, are formed in the row direction by said first metallic layer,
   wherein said local word lines and said first word lines are connected to extend in parallel with each other, and
   wherein said local word lines have a lower sheet resistance than said first word lines.

2. A semiconductor memory device according to claim 1 further including:

first MOSFETs coupled between said bit lines of said bit line pairs to reduce the voltage differences of bit lines of said bit line pairs when said memory device turns from data writing to data reading.

3. A semiconductor memory device according to claim 2, wherein said first MOSFETs are located substantially at a mid-point of said bit lines.

4. A semiconductor memory device according to claim 1 further including:
MOSFETs which are connected across bit line pairs and adapted to become conductive during data reading;
column selection means for conducting signals on bit line pairs selected by column decoders to common data line pairs; and
amplifiers for amplifying the data signals placed on said common data line pairs,
wherein each of said amplifiers includes MOSFETs each of which is formed divisionally in adjacent locations on said substrate, wherein the divided MOSFETs have their gate electrodes located axial symmetrically or point symmetrically.

5. A semiconductor memory device according to claim 1, wherein said memory cell array is divided in said row direction into a plurality of cell arrays.

6. A semiconductor memory device according to claim 5, wherein said memory cells are further divided into a plurality of blocks smaller in number than said cell arrays, each block being connected to data bus pairs for delivering signals on common data line pairs after the signals have been amplified by amplifiers, and
wherein in a normal operation mode, one of said blocks is selected and data are read out of memory cells in the selected block, and in a test mode, said blocks are selected, data are read out of memory cells in the blocks, amplified and placed on the data buses, and the data on the data bus pairs undergo a logical operation, wherein a result of said logical operation is outputted.

7. A semiconductor memory device according to claim 5, wherein said memory cells are further divided into a plurality of blocks smaller in number than said cell arrays, and
wherein each of said blocks is provided with relief memory cells used to relieve defective memory cells, a defective memory cell in a block being relieved by a relief memory cell within the same block.

8. A semiconductor memory device according to claim 1, wherein said gate electrodes of said transfer transistors are formed of the same polysilicon layer as the first word lines.

9. A semiconductor memory device according to claim 1, wherein said main word lines are longer than said local word lines.

10. A semiconductor memory device according to claim 1, wherein said first metallic layer is comprised of tungsten, and said second and third metallic layers are comprised of aluminum.

11. A semiconductor memory device according to claim 10, wherein said third metallic layer is thicker than said first and second metallic layers.

12. A semiconductor memory device according to claim 10, wherein said first metallic layer has a sheet resistance of approximately 500 $\Omega$/sq, said second metallic layer has a sheet resistance of approximately 200 $\Omega$/sq, and the third metallic layer has a sheet resistance of approximately 50 $\Omega$/sq.

13. A semiconductor memory device comprising:
a plurality of memory cells of static type formed on a semiconductor substrate in a row direction and a column direction to form a memory cell array, each memory cell including two drive MOSFETs, two transfer MOSFETs and two load elements;
first word lines formed of polysilicon coupled to gate electrodes of said transfer transistors of said memory cells, wherein said first word lines each have first and second ends and extend in said row direction;
local word lines formed of a first metallic layer, wherein said local word lines are coupled to the first and second ends of the first word lines and extend substantially in parallel with said first word lines in the row direction, and wherein said local word lines have a lower sheet resistance than said first word lines;
bit line pairs, formed of a second metallic layer, extending in said column direction to be coupled to source-drain paths of said transfer transistors, wherein said second metallic layer is formed over said first metallic layer and has a lower sheet resistance than said first metallic layer; and
main word lines, formed of a third metallic layer, extending in said row direction and coupled to said local word lines, wherein said main word lines are longer than said local word lines and said first word lines, and wherein said third metallic layer is formed over said second metallic layer and has a lower sheet resistance than said second metallic layer.

14. A semiconductor memory device according to claim 13, wherein said gate electrodes of said transfer transistors are formed of the same polysilicon layer as the first word lines.

15. A semiconductor memory device according to claim 13, wherein said first metallic layer is comprised of tungsten, and said second and third metallic layers are comprised of aluminum.

16. A semiconductor memory device according to claim 15, wherein said third metallic layer is thicker than said first and second metallic layers.

17. A semiconductor memory device according to claim 15, wherein said first metallic layer has a sheet resistance of approximately 500 $\Omega$/sq, said second metallic layer has a sheet resistance of approximately 200 $\Omega$/sq, and the third metallic layer has a sheet resistance of approximately 50 $\Omega$/sq.

18. A semiconductor memory device according to claim 13, wherein said first metallic layer has a sheet resistance of approximately 500 $\Omega$/sq, said second metallic layer has a sheet resistance of approximately 200 $\Omega$/sq, and the third metallic layer has a sheet resistance of approximately 50 $\Omega$/sq.

* * * * *